United States Patent
Vishne et al.

(10) Patent No.: US 11,601,141 B2
(45) Date of Patent: Mar. 7, 2023

(54) ERROR CORRECTION BASED ON PHYSICAL CHARACTERISTICS FOR MEMORY

(71) Applicant: Western Digital Technologies, Inc., San Jose, CA (US)

(72) Inventors: Gadi Vishne, Petah Tikva (IL); David Rozman, Kiryat-Malakhi (IL); Alex Bazarsky, Holon (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 49 days.

(21) Appl. No.: 17/187,695

(22) Filed: Feb. 26, 2021

(65) Prior Publication Data
US 2022/0278697 A1  Sep. 1, 2022

Related U.S. Application Data

(60) Provisional application No. 63/131,312, filed on Dec. 28, 2020.

(51) Int. Cl.
| | | |
|---|---|---|
| H03M 13/00 | (2006.01) | |
| H03M 13/35 | (2006.01) | |
| G06F 11/10 | (2006.01) | |
| G11C 16/10 | (2006.01) | |
| G11C 16/26 | (2006.01) | |
| G11C 16/04 | (2006.01) | |

(52) U.S. Cl.
CPC ....... H03M 13/353 (2013.01); G06F 11/1068 (2013.01); G11C 16/0483 (2013.01); G11C 16/10 (2013.01); G11C 16/26 (2013.01)

(58) Field of Classification Search
CPC ........ G11C 11/5642; G11C 2029/0411; G11C 16/26; G11C 29/02; G11C 2211/5644; G06F 11/1044
See application file for complete search history.

(56) References Cited

U.S. PATENT DOCUMENTS

| | | | | |
|---|---|---|---|---|
| 6,888,897 | B1* | 5/2005 | Nazari | H04L 1/005 |
| | | | | 714/752 |
| 9,450,610 | B1* | 9/2016 | Micheloni | H03M 13/6325 |
| 9,489,257 | B2* | 11/2016 | Ish-Shalom | H03M 13/6325 |
| 10,574,272 | B2* | 2/2020 | Kumano | H03M 13/2906 |
| 10,613,927 | B1* | 4/2020 | Symons | H03M 13/45 |
| 10,884,855 | B1* | 1/2021 | Yazovitsky | G11C 11/4074 |
| 2011/0093652 | A1* | 4/2011 | Sharon | G06F 11/1072 |
| | | | | 711/E12.008 |
| 2014/0359381 | A1* | 12/2014 | Takeuchi | G06F 11/073 |
| | | | | 714/704 |

FOREIGN PATENT DOCUMENTS

JP        2019168853 A    10/2019

* cited by examiner

*Primary Examiner* — Esaw T Abraham
(74) *Attorney, Agent, or Firm* — Kunzler Bean & Adamson

(57) ABSTRACT

Apparatuses, systems, and methods are presented for error correction based on physical characteristics for memory. A controller may be configured to read a set of encoded bits from a set of cells of a memory array. The controller may be configured to divide the encoded bits into reliability groups based on one or more persistent physical characteristics associated with cells of the set of cells. The controller may be configured to provide reliability estimates based on the reliability groups to a soft decision decoder for decoding the encoded bits.

18 Claims, 8 Drawing Sheets

ERROR CORRECTION BASED ON PHYSICAL CHARACTERISTICS FOR MEMORY

CROSS-REFERENCES TO RELATED APPLICATIONS

This application claims the benefit of U.S. Provisional Patent Application No. 63/131,312 entitled "ERROR CORRECTION BASED ON PHYSICAL CHARACTERISTICS FOR MEMORY" and filed on Dec. 28, 2020, for Gadi Vishne, et al., which is incorporated herein by reference.

TECHNICAL FIELD

The present disclosure, in various embodiments, relates to data storage and memory, and more particularly relates to error correction based on physical characteristics for memory.

BACKGROUND

Data to be stored or transmitted may be encoded using an error correcting code (ECC), which adds redundant information to the encoded data. If errors occur in storage or transmission of the encoded data, the redundant data may be used to decode and recover the original data. "Hard bits" used by ECC decoders include the encoded data as received or read, including redundant bits and possible errors. Additionally, some decoders may receive and use additional information about the estimated reliability of the hard bits. Receiving estimates of which hard bits are more likely or less likely to be erroneous facilitates determining which bits are actually erroneous, to decode and recover the original data.

Reliability estimates for data read from memory may include information about the physical or electrical property that is altered to store the data. A property of a memory cell that can be intentionally altered to store data may also change inadvertently over time, resulting in errors. For example, if the resistance of a resistive memory cell is near a boundary between lower-resistance and higher-resistance states, the data stored by the cell may be more likely to be erroneous (due to drift from an adjacent state), but if the resistance is not near a boundary between states, the stored data may be more likely to be reliable. However, various other physical properties of memory may also be correlated with data reliability.

SUMMARY

Apparatuses are presented for error correction based on physical characteristics for memory. An apparatus, in some embodiments, includes an array of memory cells and a controller. A controller, in some embodiments, is configured to read a set of encoded bits from a set of cells of the array. A controller, in some embodiments, is configured to divide the encoded bits into reliability groups based on one or more persistent physical characteristics associated with cells of the set of cells. A controller, in some embodiments, is configured to provide reliability estimates based on the reliability groups to a soft decision decoder for decoding the encoded bits.

Methods are presented for error correction based on physical characteristics for memory. A method, in some embodiments, includes reading, from a set of memory cells, a received codeword for an error correcting code. A method, in some embodiments, includes assigning bits of the received codeword into reliability groups based on one or more persistent physical characteristics associated with cells of the set of cells. A method, in some embodiments, includes providing reliability estimates based on the reliability groups to a soft decision decoder for decoding the received codeword.

An apparatus, in another embodiment, includes means for reading a set of encoded bits from a set of memory cells. In some embodiments, an apparatus includes means for determining a correspondence between the encoded bits and at least two reliability groups based on one or more persistent physical characteristics associated with cells of the set of cells. In some embodiments, an apparatus includes means for providing reliability estimates based on the reliability groups to a soft decision decoder for decoding the encoded bits.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
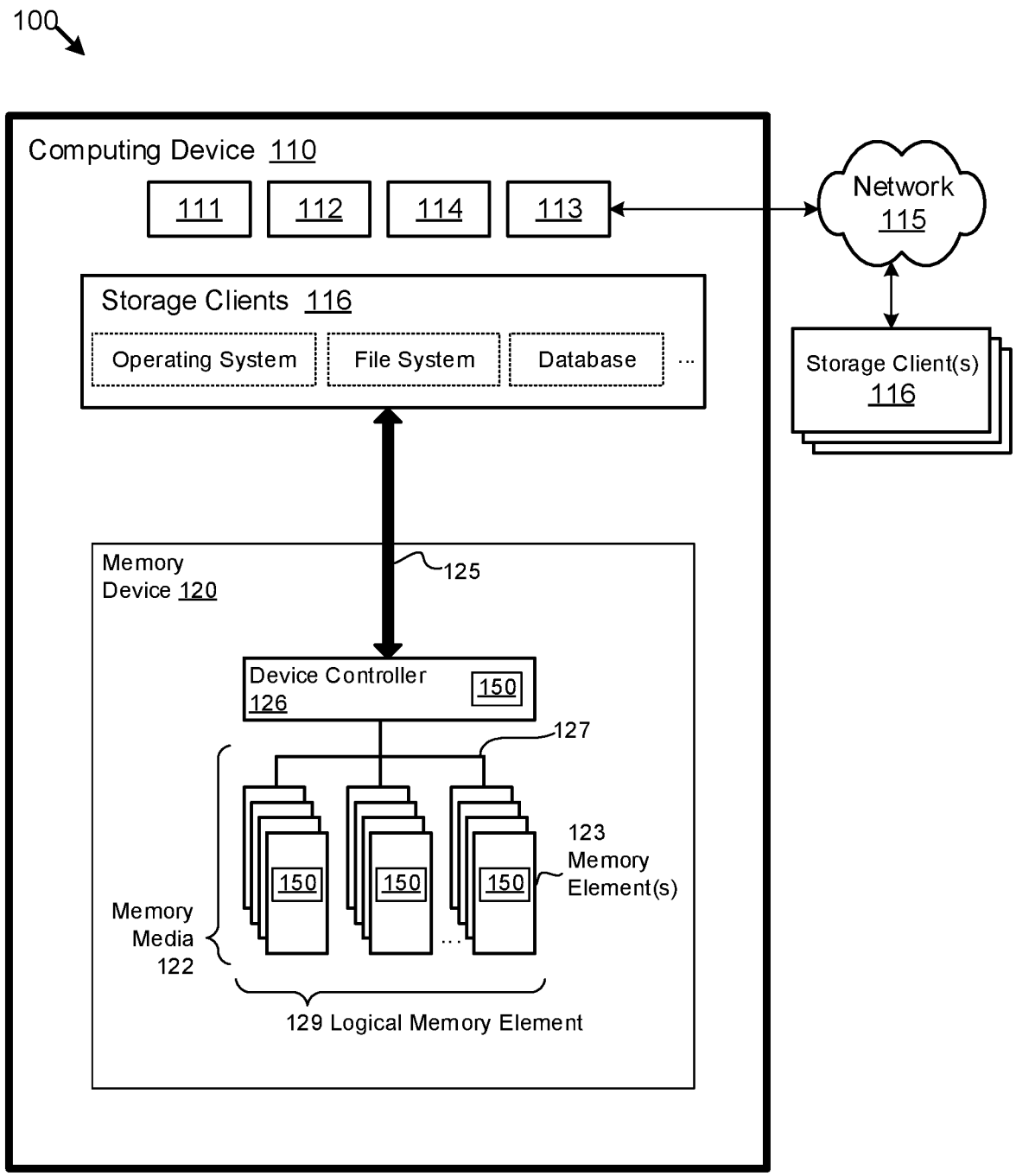
FIG. 1 is a schematic block diagram illustrating one embodiment of a system comprising read components.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, or circuitry, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

FIG. 1 is a block diagram of one embodiment of a system 100 comprising read components 150 for a memory device 120. The read components 150 may be part of memory elements 123, a device controller 126 external to the memory elements 123, and/or a device driver for the memory device 120. The read components 150 may communicate with or operate on a memory device 120 for or within a computing device 110, which may comprise a processor 111, volatile memory 112, a computer readable storage medium 114 and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or memory device 120 to a communication network 115, such as an Internet Protocol network, a Storage Area Network, or the like.

The memory device 120, in various embodiments, may be disposed in one or more different locations relative to the computing device 110. In one embodiment, the memory device 120 comprises one or more volatile and/or non-volatile memory elements 123, such as semiconductor chips or packages or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a bus 125 of the computing device 110 to communicate with storage clients 116. In one embodiment, the memory device 120 may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

In one embodiment, the memory device 120 is configured to receive storage requests from a device driver or other executable application via a bus 125. The memory device 120 may be further configured to transfer data to/from a device driver and/or storage clients 116 via the bus 125. Accordingly, the memory device 120, in some embodiments, may comprise and/or be in communication with one or more direct memory access (DMA) modules, remote DMA modules, bus controllers, bridges, buffers, and so on to facilitate the transfer of storage requests and associated data. In another embodiment, the memory device 120 may receive storage requests as an API call from a storage client 116, as an IO-CTL command, or the like.

According to various embodiments, a device controller 126 may manage one or more memory devices 120 and/or memory elements 123. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units may include, but are not limited to: pages, memory divisions, blocks, sectors, collections or sets of physical storage locations (e.g., logical pages, logical blocks), or the like.

The communication interface 113 may comprise one or more network interfaces configured to communicatively couple the computing device 110 and/or the memory device 120 to a network 115 and/or to one or more remote, network-accessible storage clients 116. The storage clients 116 may include local storage clients 116 operating on the computing device 110 and/or remote, storage clients 116 accessible via the network 115 and/or the communication interface 113. A device controller 126 may be part of and/or in communication with one or more memory devices 120. Although FIG. 1 depicts a single memory device 120, the disclosure is not limited in this regard and could be adapted to incorporate any number of memory devices 120.

The memory device 120 may comprise one or more elements 123 of volatile and/or non-volatile memory media 122, which may include but is not limited to: volatile memory such as SRAM and/or DRAM; non-volatile memory such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), and/or optical storage media; or other memory and/or storage media. The one or more elements 123 of memory media 122, in certain embodiments, comprise storage class memory (SCM).

While the memory media 122 is referred to herein as "memory media," in various embodiments, the memory media 122 may more generally comprise one or more volatile and/or non-volatile recording media capable of recording data, which may be referred to as a memory medium, a storage medium, or the like. Further, the memory device 120, in various embodiments, may comprise a recording device, a memory device, a storage device, or the like. Similarly, a memory element 123, in various embodiments, may comprise a recording element, a memory element, a storage element, or the like.

The memory media 122 may comprise one or more memory elements 123, which may include, but are not limited to: chips, packages, planes, die, or the like. A device controller 126, external to the one or more memory elements 123, may be configured to manage data operations on the memory media 122, and may comprise one or more processors, programmable processors (e.g., FPGAs), ASICs, micro-controllers, or the like. In some embodiments, the device controller 126 is configured to store data on and/or read data from the memory media 122, to transfer data to/from the memory device 120, and so on.

The device controller 126 may be communicatively coupled to the memory media 122 by way of a bus 127. The bus 127 may comprise an I/O bus for communicating data to/from the memory elements 123. The bus 127 may further comprise a control bus for communicating addressing and other command and control information to the memory elements 123. In some embodiments, the bus 127 may communicatively couple the memory elements 123 to the device controller 126 in parallel. This parallel access may allow the memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the memory elements 123.

The device controller 126 may comprise and/or be in communication with a device driver executing on the computing device 110. A device driver may provide storage services to the storage clients 116 via one or more interfaces. For example, a device driver may include a memory device interface that is configured to transfer data, commands, and/or queries to the device controller 126 over a bus 125, as described above. In some embodiments, a device driver may include executable code stored by a non-transitory computer readable medium (e.g., volatile memory 112, or computer readable storage medium 114), and/or a processor executing the code (e.g., processor 111).

In various types of memory elements 123 and/or memory devices 120, stored data may include errors when the data is read. Memory elements 123 may include arrays of memory cells, where physical or electrical properties of the cells are alterable to store data. For example, data may be stored by altering transistor threshold voltages for transistor-based memory cells, resistances for resistive memory cells, or the like. However, a property of a memory cell that can be intentionally altered to store data may also change inadvertently over time, resulting in errors.

Errors may also occur due to physical variations, abnormalities, or defects in memory cells, in circuitry that is coupled memory cells, in input/output circuitry, or the like. For example, the bus 127 may include parallel data lines between a memory element 123 and the device controller 126, but the data lines may not be fully synchronized to switch between one data value and the next at the same time. Thus, errors may arise if the device controller 126 samples data from data lines before all the data lines have transitioned to assert the correct data value. As another example, writing data to a row of memory cells coupled to a word line may include operating transistors coupled to bit lines, to control which memory cells in the row are programmed to a new data value and which memory cells in the row are inhibited from being programmed. Physical variation in the threshold voltages for the transistors that control programming or inhibiting of the memory cells may mean that some transistors are on when they are supposed to be off, or off when they are supposed to be on. Thus, errors may arise due to memory cells being incorrectly programmed or inhibited.

To avoid or mitigate various types of errors, data may be encoded using an error correcting code (ECC), which adds redundant information to the encoded data prior to storing the data on memory elements 123. Memory elements 123, a device controller 126, and/or a device driver for a memory device 120 may include an ECC decoder that receives the data read from the memory cells, including redundant bits and possible errors, and uses the redundant data to decode and recover the original data. In some embodiments, a "hard-decision" decoder may operate on "hard bits" which are the encoded data values themselves, with possible errors. In some embodiments, however, a "soft-decision" decoder may receive and use additional information about the estimated reliability of the hard bits. For example, a soft decision decoder may receive reliability estimates in the form of a categorization of bits as reliable, unreliable (possibly intermediate reliability), or the like, or in the form of probabilities or likelihoods that the hard bits are correct, probability or likelihood ratios, log-likelihoods, differences of log-likelihoods (equivalent to logs of likelihood ratios, or the like.

In some embodiments, reliability estimates may be separate information received by a soft-decision decoder in addition to the hard bits. For example, probabilities that the hard bits are correct may accompany the hard bits. In other embodiments, reliability estimates may incorporate the hard bits, so that hard bits are not separately received by a soft-decision decoder. For example, reliability estimates in the form of a ratio between the likelihood that a bit is a binary one and the likelihood that the bit is a binary zero may indicate that the hard bit is a one if the ratio is greater than one, or a zero of the ratio is less than one. Similarly, reliability estimates in the form of a log of the likelihood ratio (a "log likelihood ratio" or "LLR") may indicate that the hard bit is a one if the LLR is positive, and that the hard bit is a zero if the LLR is negative. In various embodiments, reliability estimates may indicate which hard bits of ECC-encoded data are more likely or less likely to be erroneous, and thus facilitate a soft-decision decoder determining which bits are actually erroneous, to decode and recover the original unencoded data.

In some embodiments, reliability estimates may be determined for a soft-decision decoder by performing a soft bit read. Where errors arise due to drifting of memory cells' alterable physical property between states, a soft bit read can determine which memory cells are more or less likely to have experienced drift errors, based on whether the alterable property is nearer or further from a threshold between states. However, as described above, various other physical properties of memory, such as variations in data line synchronization, variations in transistors that control programming and inhibiting of memory cells, or the like, may also be correlated with data reliability.

Accordingly, in various embodiments, memory elements 123, a device controller 126, and/or a device driver for a memory device 120 may include read components 150. A read component 150, in some embodiments, is configured to read a set of encoded bits from a set of memory cells, and to divide the encoded bits into reliability groups based on one or more persistent physical characteristics associated with cells of the set of cells. A persistent physical characteristic associated with a memory cell, in various embodiments, which may be used as the basis for the read component 150 to assign a data value from the memory cell into a reliability group, may be a characteristic other than the alterable physical property that is used to store data. For example, bits from memory cells may be grouped into reliability groups by a read component 150 based on persistent physical characteristics such as which data line the data from each memory cell would be transferred on, threshold voltages for transistors that control programming and inhibiting of memory cells, or other physical characteristics associated with the cells.

With the encoded bits divided or assigned into reliability groups, a read component 150 may provide reliability estimates based on the reliability groups to a soft decision decoder, for decoding the encoded bits. Reliability estimates for groups based on persistent physical characteristics may be used in addition to or in place of reliability estimates based on a soft bit read of the cells' alterable physical property, to improve the performance of an ECC decoder, by increasing decoding speed, reducing rates of uncorrectable errors, or the like. Read components 150 are described in further detail below with reference to FIGS. 2-10.

Figure 2:
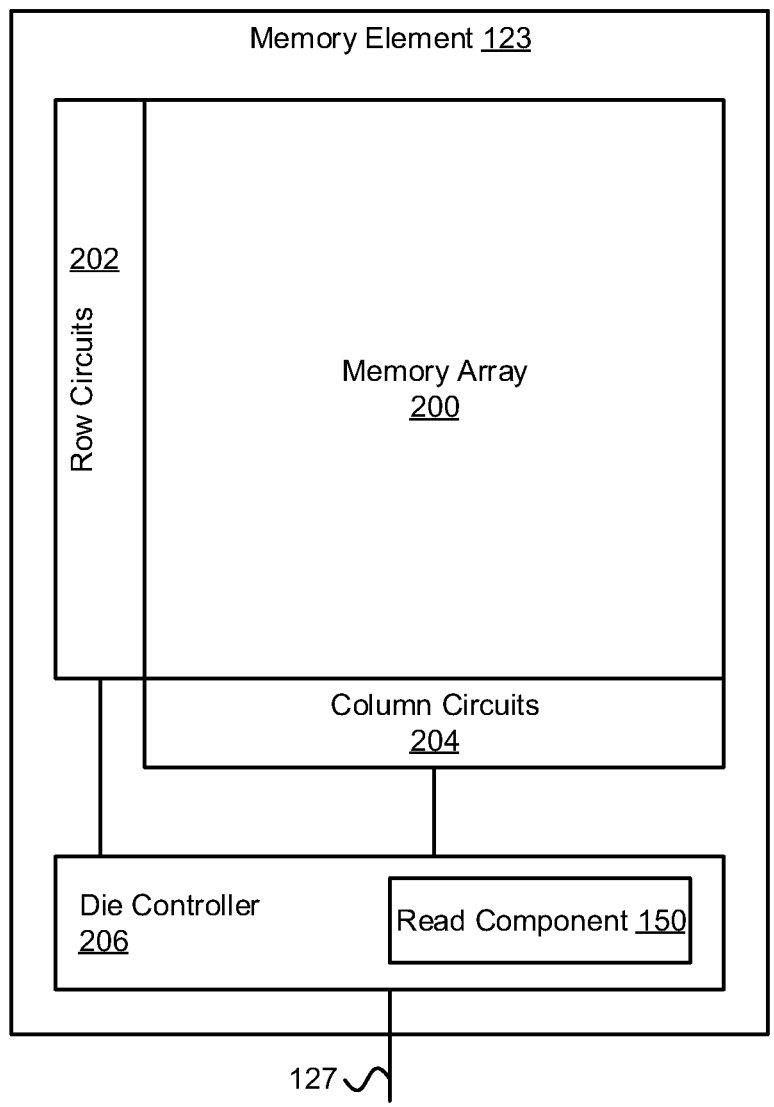
FIG. 2 is a schematic block diagram illustrating one embodiment of memory element comprising a read component.

FIG. 2 depicts one embodiment of a memory element 123. The memory element 123 may be substantially similar to the memory element 123 described above with reference to FIG. 1, and may be a chip, a die, a die plane, or the like. In the depicted embodiment, the memory element 123 includes a memory array 200, row circuits 202, column circuits 204, and a die controller 206.

In various embodiments, a memory element 123 may be an integrated circuit that includes both a core array 200 of memory cells (e.g., volatile and/or non-volatile memory cells) for data storage, and peripheral components (e.g., row circuits 202, column circuits 204, and/or die controller 206) for communicating with the array 200. In certain embodiments, one or more memory elements 123 may be included in a memory device 120.

In the depicted embodiment, the array 200 includes a plurality of memory cells. In one embodiment, the array 200 may be a two-dimensional array. In another embodiment, the array 200 may be a three-dimensional array that includes multiple planes and/or layers of memory cells. In various embodiments, the array 200 may be addressable by rows via row circuits 202, and by columns via column circuits 204. In various embodiments, a "cell" may refer to a smallest or fundamental physical unit of memory, or storage, for an array 200, and may be referred to interchangeably as a "storage cell," a "memory cell" or the like. For example, a cell may be a floating gate transistor for NAND flash memory, a memristor for resistive memory, or the like. Thus, in a further embodiment, an array 200 of cells may be a two-dimensional grid, a three-dimensional block, a group, or other similar set of cells where data can be physically stored, for short-term memory use, long-term storage use, or the like.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder that translates a received address to a hardware address used by the row circuits 202 and column circuits 204, a state machine that implements and controls the memory operations, and the like. The die controller 206 may communicate with a computing device 110, a processor 115, a bus controller, a storage device controller, a memory module controller, or the like, via bus 127, to receive command and address information, transfer data, or the like.

In one embodiment, the die controller 206 may include a read component 150, which may be substantially similar to the read component 150 described above with reference to FIG. 1. Although the read component 150 is depicted in FIG. 2 as a component of the die controller 206, a read component 150 in some embodiments may include or communicate with components of row circuits 202, column circuits 204 or the like. For example, in some embodiments, circuitry for reading data from the array 200 may be included in the row circuits 202 and column circuits 204, and the read component 150 may include or communicate with the circuitry for reading data.

Figure 3:
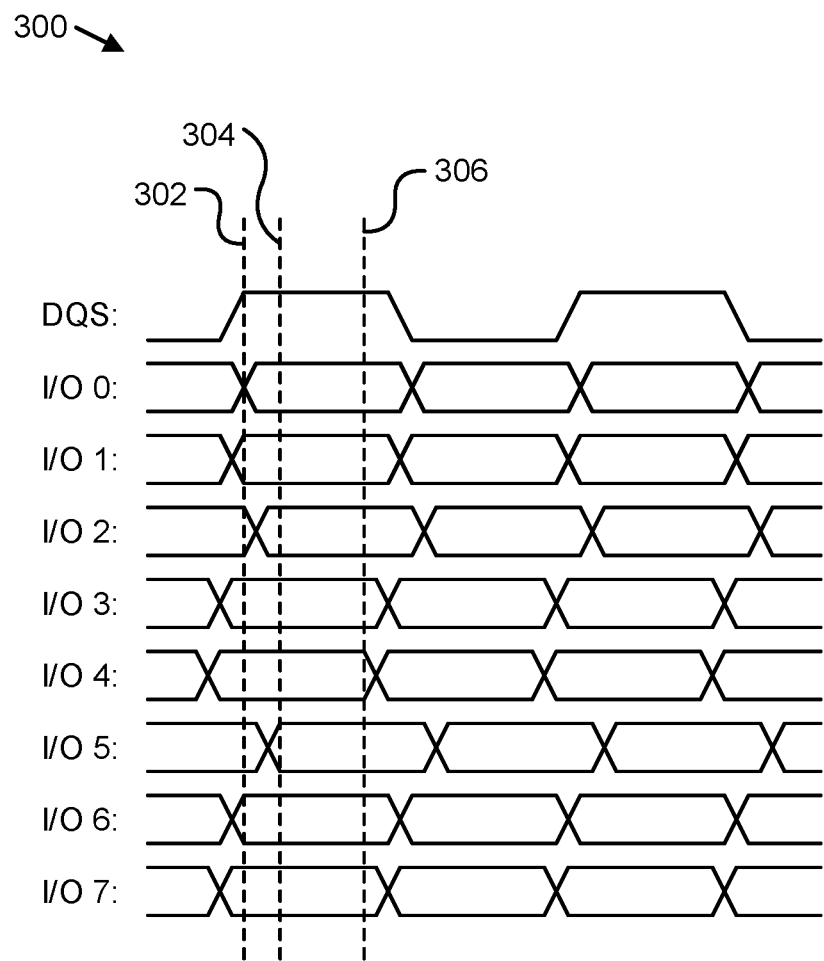
FIG. 3 is a timing chart showing desynchronization between data lines and a strobe line.

FIG. 3 is a timing chart 300 showing one example of desynchronization between data lines and a strobe line, for data being transmitted from a memory element 123 to a device controller 126 over a bus 127. In the depicted timing chart 300, time increases along the horizontal axis, and signal voltage is shown on a vertical axis for multiple data lines and a strobe line. In various embodiments, a bus 127 between memory elements 123 and a device controller 126 may include multiple data lines and a data strobe line. For example, a bus may include 8 data lines, 16 data lines, 32 data lines, 64 data lines, or another number of data lines. When data is read from a memory array 200, signals on data lines may be driven high or low (e.g., to specified high and low voltages corresponding to binary data values) to signal a binary one or zero, and may transition to subsequent high or low voltages to signal subsequent binary data values with each rising or falling edge of a data strobe. Because a data line may transmit a one or a zero at each edge of the data strobe, the signals for data lines are illustrated as going both high and low at each edge, so as to indicate that data is being transmitted without illustrating any particular data value.

In various embodiments, the DQS strobe functions as a clock for marshalling data on the bus 127. Rather than providing an external clock signal to a memory element 123 and a device controller 126 for synchronizing data transfers on the bus 127, the memory element 123 produces the DQS strobe signal on the data strobe line alongside the data on the data lines, and the device controller 126 uses the DQS strobe as a clock to determine when to sample each new data value from the data lines.

In the timing chart 300, dashed vertical lines indicate different times 302, 304, 306. These lines extend across the signals to show how each signal has or has not changed at the different times. At a DQS edge time 302, a rising or falling edge of the DQS strobe occurs (FIG. 3 depicts a rising edge) as the DQS voltage goes from low to high, or from high to low. With perfect synchronization between the DQS strobe and data lines, the data lines would all transition to their next values at the DQS edge time 302—the signals in FIG. 3 would be perfectly vertically aligned—and the device controller 126 could receive eight bits of data from the memory element 123 by sampling the signal from data lines I/O 1 through I/O 7 at any time between the DQS edge time 302 and the next edge of the DQS strobe, then get the next eight bits by sampling the data lines again, and so on.

However, such perfect synchronization is highly unlikely. Signal transitions on the data lines may be advanced or delayed relative to the DQS edge time 302 by different amounts for different data lines, due to varying physical characteristics such as varying switching speeds for circuitry driving the data line signals, variations in lengths of the data lines and the data strobe line on a printed circuit board, or the like. Thus, as depicted in FIG. 3, signals may be desynchronized. In the example depicted in the timing chart 300, data line I/O 4 is the most advanced line, where transitions are earliest relative to the DQS edge time 302, and data line I/O 5 is the most delayed line, where transitions are latest relative to the DQS edge time 302. In other examples, other lines may be more advanced, or more delayed.

To compensate for this desynchronization between data lines, a device controller 126 may receive data from a memory element by sampling from the data lines with some delay after the DQS edge time 302. A window for sampling data from the data lines begins at a left edge 304, when the most delayed data line (e.g., I/O 5) has transitioned to a new value. The window continues with all data lines consistent until a right edge 306, when the least delayed or most advanced data line (e.g., I/O 4) transitions to the next value. A delay time that the device controller 126 waits between seeing the DQS strobe edge and sampling from the data lines may result in data being sampled some time (e.g., halfway) between the left edge 304 and the right edge 306 of the window.

However, it may be a time-consuming process for the device controller 126 to determine the left edge 304 and the right edge 306 of the window. This process may involve the device controller 126 writing known data to a memory element 123, and repeatedly attempting to read the known data over the bus 127, with different values for the sampling delay. For example, the device controller 126 may iteratively read data, increasing the sampling delay from zero with each iteration until it can read the known data with no errors, at which point the left edge 304 of the window has been established. Then, the device controller 126 may continue iteratively reading the data and increasing the sampling delay until errors appear again, at which point the right edge 306 of the window has been established. The repeated reads to find both edges of the window may use a significant amount of time.

Additionally, the desynchronization between data lines may not be constant, but may change over time. For example, circuitry for driving different data lines may wear differently over time, changing the amount of time by which signals on various data lines are advanced or delayed. Thus, in some embodiments, a device controller 126 (or any other component that similarly receives data on desynchronized lines) may initiate a delay recalibration process, to update a delay for sampling data from data lines by once again iteratively reading known data, as described above, to establish the left edge 304 and the right edge 306 of the sampling window. A device controller 126 may initiate a delay recalibration process at power-on, after a certain amount of time has passed since the last delay recalibration, after an error rate exceeds a threshold, or the like. However, due to the considerable amount of time used by delay recalibration, increasing error correction performance to handle higher error rates or to handle errors more quickly may increase device availability by reducing the frequency of delay recalibrations.

In some embodiments, memory cells of an array 200 consistently send and receive data cells using the same data lines. Data from a row of an array 200 may be read from memory cells, and sent to the device controller 126 eight bits at a time over data lines I/O 0 through I/O 7. For example, when reading from 64 memory cells, data line I/O 0 sends bits from memory cell 0, 8, 16, 24, 32, 40, 48, and 56; data line I/O 1 sends bits from memory cell 1, 9, 17, 25, 33, 41, 49, and 57; and so on through data line I/O 7 sending bits from memory 7, 15, 23, 31, 39, 47, 55, and 63. Thus, the data line that sends or receives data from a memory cell may be a persistent physical characteristic associated with the memory cell, and may be indicated by an interface bit index. For example, interface bit index 0 may refer to memory cells that transmit data using data line I/O 0; interface bit index 1 may refer to memory cells that transmit data using data line I/O 1, and so on.

As desynchronization changes over time, timing for a data line may shift so that some transitions between data values occur within the sampling window rather than outside the sampling window, causing errors. These errors will specifically affect the data line that is newly out of synch, without affecting bits on other data lines. Thus, in some embodiments, a read component 150 may group bits read from memory cells into reliability groups based on interface bit indices. For example, with eight data lines, a read component 150 may divide bits into eight different groups by interface bit index. The read component 150 may then provide reliability estimates based on the reliability groups to a soft decision decoder. For example, if cells with interface bit index 5 are discovered to be more error-prone (e.g., due to desynchronization of data line I/O 5), then a read component 150 may provide lower reliability estimates to the decoder for bits in the reliability group for interface bit index 5 than for bits in other reliability groups. Using this reliability information in a soft decision decoder may reduce or avoid uncorrectable errors, thus extending the time between time-consuming delay recalibrations.

Figure 4:
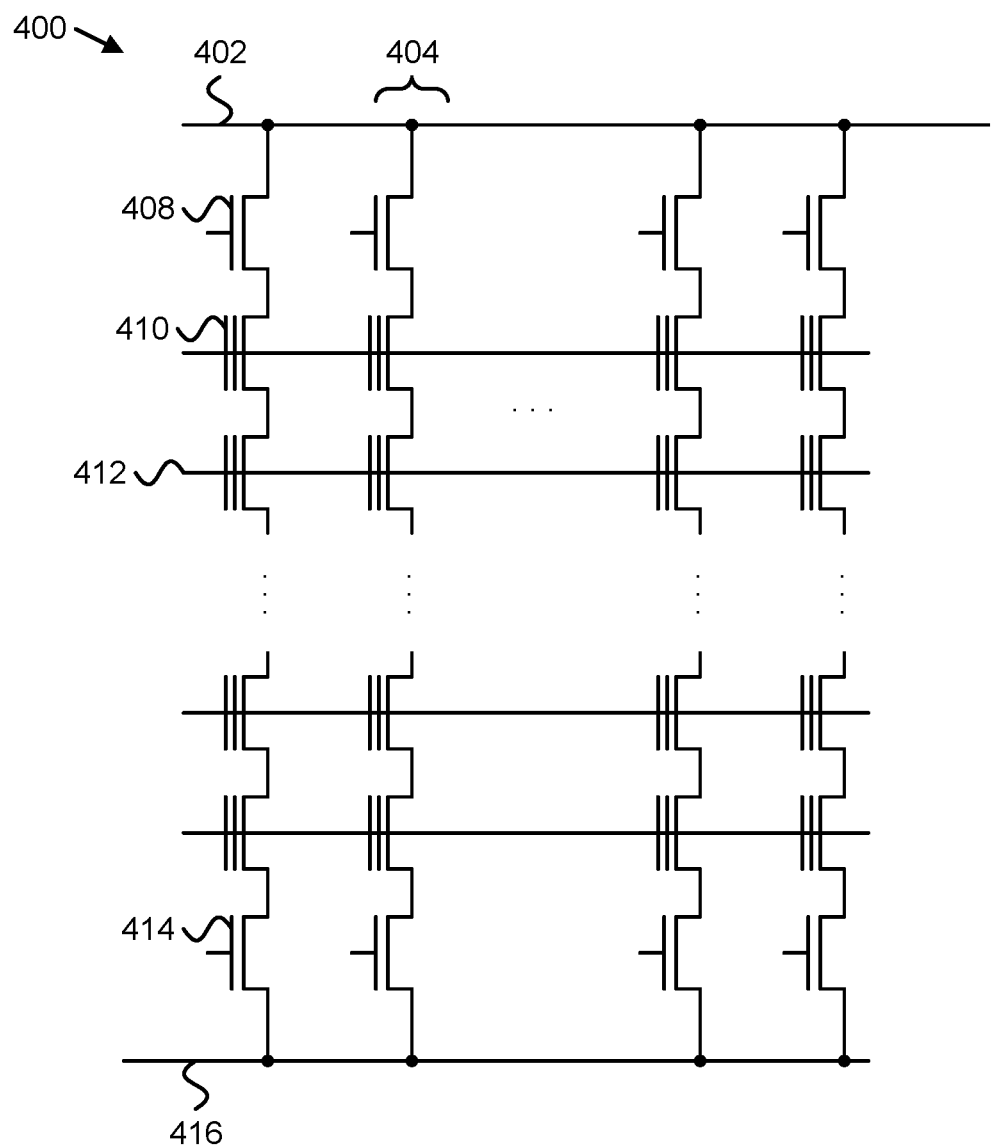
FIG. 4 is a schematic diagram illustrating a portion of a memory array, in one embodiment.

FIG. 4 depicts one portion 400 of a memory array 200, in one embodiment. In the depicted embodiment, the memory array 200 is a NAND flash memory array that stores data using floating gate transistors 410, accessed via bit lines 402 and word lines 412. In a two-dimensional memory array 200, bit lines 402 may be coupled to columns of floating gate transistors 410, and word lines 412 may be coupled to rows. In a three-dimensional array 200, word lines 412 may be coupled to planes or layers of floating gate transistors 410, and bit lines 402 may be coupled to multiple vertical columns, with select transistors (e.g., transistors 408, 414 to determine which vertical column of cells is being accessed). In the depicted embodiment, a portion 400 of an array 200 corresponding to one bit line 402 includes the bit line 402, one or more NAND strings 404, word lines 412, and a source line 416. The word lines 412 may be coupled to row circuits 202 and the bit line 402 may be coupled to column circuits 204 as described above with reference to FIG. 2.

In various embodiments, a memory cell may be coupled between a source line 416 and a bit line 402. In certain embodiments, a "cell" may refer to a smallest or fundamental physical unit of memory, or storage, for an array 200, and may be referred to interchangeably as a "storage cell," a "memory cell" or the like. For example, a cell may be a floating gate transistor for NAND flash memory, a memristor for resistive memory, or the like. Thus, in a further embodiment, an array 200 of cells may be a two-dimensional grid, a three-dimensional block, a group, or other similar set of cells where data can be physically stored, for short-term memory use, long-term storage use, or the like. In certain embodiments, a non-volatile memory element 124 may include further or peripheral components in addition to the array 200, such as word line drivers, bit line drivers, sense amplifiers for sensing bit line voltages, latches to store data that is being read from or written to the array 200, and the like.

A physical or electrical property of a memory cell may be alterable to store data. For example, transistor-based memory cells (e.g., NAND) may store data based on an alterable threshold voltage for turning on the transistor. Similarly, resistive memory cells (e.g., PCM or MRAM) may store data based on an alterable resistance. A range of possible values for a cell's alterable physical property may be divided into states, corresponding to data values. With bias voltages applied to the cell at a source line 416, a word line 412, a bit line 402, and/or the like, the state of the cell may affect the voltage, current, or other electrical property of the bit line 402. A sense amplifier may sense the affected electrical property (corresponding to the state of the cell), and may output a data result. In one embodiment, an electrical current that passes through a cell between a bit line 402 and a source line 416 may pass through a single cell. In the depicted embodiment, however, a chain of cells may be coupled in series between a source line 416 and a bit line 402, and an electrical current that passes through one cell may pass through other cells in the chain. However, the other cells may be controlled to be on (e.g., in a known, low-resistance state), so that the sensed electrical property of the bit line 402 corresponds to the state of one of the cells in the chain. A single cell or a cell in a chain may be equivalently referred to as coupled between a source line 416 and a bit line 402. Additionally, a cell may be referred to as coupled between a source line 416 and a bit line 402 whether the cell is directly connected to the source line 416 and the bit line 402, or coupled via other components such as select transistors 408, 414.

In various embodiments, bit lines 402 may be coupled to memory cells in a variety of ways. For example, in the depicted embodiment, a bit line 402 is coupled to multiple NAND strings 404, where a NAND string 404 includes a plurality of storage cells connected in series, and where individual NAND strings 404 are selectable via select transistors 408, 414. In another embodiment, a bit line 402 may be coupled to a single NAND string 404. In a further embodiment, two-terminal cells may be coupled to bit lines 402 and word lines 412 (e.g., in a cross-point array where a word line 412 addresses a row of cells and a bit line 401 addresses a column of cells), and cells may or may not be coupled to a source line 416. Various ways of coupling memory cells to bit lines 402 will be clear in view of this disclosure. In certain embodiments, the cells may be coupled to the bit lines 402 such that electrical currents in the bit lines 402 during a sense operation correspond to memory cell states.

In the depicted embodiment, a NAND string 404 includes a plurality of floating gate transistors 410. In a floating gate transistor 410, a conductive "floating" gate is positioned over a channel region of a semiconductor substrate, between source and drain regions. A control gate is positioned over the floating gate. The floating gate is electrically isolated (e.g., by oxide layers) from the control gate and the substrate, and may store a charge. The charge on a floating gate may be increased (e.g., during programming) or decreased (e.g., during erasure) by Fowler-Nordheim tunneling, hot carrier injection, or the like. Because the floating gate is between the control gate and the substrate, the amount of charge on the floating gate may affect the "threshold voltage" Vt that is sufficient to turn the floating gate transistor 410 "on" (e.g., to create a conductive channel between source and drain regions) when applied to the control gate. Thus, the amount of charge on the floating gate, or, equivalently, the threshold voltage Vt for the floating gate transistor 410 may be manipulated to store data.

In one embodiment, in "single level cell" (SLC) NAND flash memory, a single read voltage threshold may be established for a floating gate transistor 410, so that the floating gate transistor 410 is in an erased state (e.g., storing a binary "1") if the threshold voltage Vt for the cell is below the read voltage threshold, and in a programmed state (e.g., storing a binary "0") if the threshold voltage Vt for the cell is above the read voltage threshold. In another embodiment, for "multi level cell" (MLC), "triple level cell" (TLC) NAND flash memory, or the like, a range of possible threshold voltages Vt for a floating gate transistor 410 may be divided into multiple states, so that the floating gate transistor 410 stores more than one bit of data. In general, in various embodiments, reading data from a floating gate transistor 410 may include determining which state the threshold voltage Vt of the floating gate transistor 410 is in, by applying a read voltage to the control gate and determining whether the floating gate transistor 410 conducts between source and drain terminals. Similarly, writing data to a floating gate transistor 410 may include applying program voltage pulses to the control gate, or applying erase voltage pulses to the substrate, to change the threshold voltage Vt of the floating gate transistor 410.

Although data is stored in floating gate transistors 410 in the depicted embodiment, data in another embodiment may be stored by varying certain physical properties of other types of electrical components. For example, data may be stored by varying the resistance of a component in ReRAM, the phase of a component in PCM, or the like. A component, such as a floating gate transistor 410, with a physical property that may be altered to store data may be referred to herein as a "storage cell," a "memory cell" or the like. Thus, in the depicted embodiment, the memory array 200 of FIG. 2 may include multiple storage cells, comprising floating gate transistors 410 in NAND strings 404. In another embodiment, however, the memory array 200 of FIG. 2 may include multiple storage cells of another type.

In the depicted embodiment, a NAND string 404 includes a series of floating gate transistors 410, daisy chained source-to-drain. A source select gate (SGS) transistor 414 couples the source end of the NAND string 404 to a source line 416, and a drain select gate (SGD) transistor 408 couples the drain end of the NAND string 404 to a bit line 402. In a certain embodiment, the source line 416 may be maintained at a source voltage (e.g., 0 V, or ground), and the bit line 402 voltage may be manipulated by a sense amplifier to read or write data. The source line 416 may be referred to as a cell source line, to distinguish the source line 416 that is coupled to the cells from other connections to 0 V or ground. Word lines 412 may couple control gates of corresponding floating gate transistors 410 across multiple NAND strings 404. Thus, a full row of floating gate transistors 410 (e.g., a page of data for SLC NAND, or multiple pages of data for MLC or TLC NAND) may be addressed via a single word line 412, with individual bits read or programmed via columns or bit lines 402. In the depicted embodiment, a 3-dimensional NAND arrangement is shown, in which multiple NAND strings 404 are coupled to one bit line 402, and a bit stored by a floating gate transistor 410 is physically addressed by row (e.g., word line 412), column (e.g., bit line 402), and string 404, (e.g., selected via select transistors 408, 414). In another embodiment, in a 2-dimensional NAND arrangement, each NAND string 404 is coupled to a single bit line 402, and a bit stored by a floating gate transistor 410 is physically addressed by row (e.g., word line 412), and column (e.g., bit line 402), without separately addressing a string 404.

In one embodiment, to read data from a selected floating gate transistor 410, a sense amplifier precharges or biases the selected bit line 402. The source select transistor 414 and the drain select transistor 408 for a selected string 404 may be turned on (e.g., a voltage may be applied to control gates so that the select transistors 408, 414 are in a conducting state). Select transistors 408, 414 for unselected strings 404 may be turned off (e.g., control gates may be at 0 V). A voltage sufficient to fully turn on the unselected floating gate transistors 410 is applied via the unselected word lines 412. A read voltage is applied to the selected word line 412. If the threshold voltage Vt for the selected floating gate transistor 410 is below the applied read voltage (e.g., the storage cell is in an erased state for SLC NAND), then the selected floating gate transistor 410 conducts, and a current flows between the bit line 402 and the source line 416. Conversely, if the threshold voltage Vt for the selected floating gate transistor 410 is above the applied read voltage (e.g., the storage cell is in a programmed state for SLC NAND), then the selected floating gate transistor 410 does not conduct, and current does not flow between the bit line 402 and the source line 416 (or, a lower, or minimal current flows). Applying a single read voltage may be sufficient to distinguish between programmed and erased states for SLC NAND. Additional read voltages may be applied to distinguish between multiple states for MLC NAND, TLC NAND, or the like. A sense amplifier may sense an electrical property of the bit line 402, such as a bit line voltage, a rate of change in a bit line voltage, a bit line current, or the like, to determine the state of the cell.

In a certain embodiment, for writing as for reading, a string 404 may be selected by applying appropriate voltages to select transistors 408, 414, and unselected floating gate transistors 410 may be fully turned on by applying a sufficient voltage to unselected word lines 412. One or more program voltage pulses may be applied to the control gate for the selected floating gate transistor 410, via the selected word line 412, to change the threshold voltage Vt for the selected floating gate transistor 410. Changes to the threshold voltage Vt for the selected floating gate transistor 410 may be verified in a process similar to reading, by applying one or more program verify voltages to the selected floating gate transistor 410, and sensing whether the selected floating gate transistor 410 conducts.

In various embodiments, the degree to which a threshold voltage Vt for a selected floating gate transistor 410 changes in response to a programming pulse depends on the size of voltage between the control gate and the drain. In one embodiment, to inhibit a cell from being programmed, a sense amplifier may apply a high inhibit voltage to the drain of the selected floating gate transistor 410, via the bit line 402. In another embodiment, for fast programming, or for programming to a high threshold voltage Vt, a sense amplifier may apply a low or zero voltage to the drain of the selected floating gate transistor 410, via the bit line 402.

Read and program operations are described above in the context of reading or writing data to a single floating gate transistor 410. However, in various embodiments, a word line 412 may couple control gates for a row of floating gate transistors 410 that spans multiple NAND strings 404 and bit lines 402. Thus, a read voltage or a program voltage pulse may be applied to a word line 412, and multiple bits of data may be communicated via multiple bit lines 402, to read data from or write data to floating gate transistors 410 coupled to the selected word line 412. Floating gate transistors 410 in different NAND strings may be programmed or inhibited from programming by controlling SGD transistors 408 for the different NAND strings 404. If an SGD transistor 408 is on or open, then a corresponding floating gate transistor 410 may be exposed to a large potential different between a low-voltage program voltage on a bit line 402 and high-voltage program pulses on a word line 412. Conversely, if an SGD transistor 408 is off or closed, capacitive coupling of the corresponding floating gate transistor 410 to nearby high voltages boosts the channel potential so that Fowler-Nordheim tunneling does not occur. Thus, opening or closing an SGD transistor 408 for a NAND string 404 may correspond to programming or inhibiting a floating gate transistor 410 in the string 404.

However, because of variation between SGD transistors 408 or degradation over time, threshold voltages (where an SGD transistor 408 switches between "on" and "off" states) may vary between SGD transistors 408 or change over time, so that some transistors 408 remain closed when they should be open, or remain open when they should be closed. For example, an SGD downshift, where the threshold voltage for an SGD transistor 408 shifts down to a lower voltage than the nominal voltage, or the previous voltage, may result in the SGD transistor 408 failing to close when a low voltage is applied, with the result that floating gate transistors 410 in the same NAND string 404 will be programmed instead of being inhibited from programming. Thus, memory cells in NAND strings 404 with a downshifted SGD transistor 408 may be more prone to errors than memory cells in other NAND strings 404. Accordingly, the threshold voltage for an SGD transistor 408 in the same NAND string 404 as a memory cell, or the magnitude of the SGD downshift, may be a persistent physical characteristic associated with the memory cell, and may be used by a read component 150 as a basis for grouping bits from memory cells into reliability groups.

In various embodiments, SGD downshifts may be measured or sensed in a process similar to the process of reading from the floating gate transistors 410. With the other transistors in a NAND string 404 turned on, different gate voltages may be applied to an SGD transistor 408 to see which voltages turn the transistor on, allowing current to flow between the bit line 402 and the source line 416. With this information, SGD threshold voltages may be assigned or grouped into bins. For example, two bins may be established for SGD transistors 408 with threshold voltages above the applied read voltage and below the applied read voltage, or three bins may be established "within nominal range," "somewhat downshifted," "very downshifted," or the like. The number of groupings may depend on the number of gate voltages applied to sense the SGD downshift. A read component 150 may then group bits from memory cells into reliability groups based on SGD downshifts for SGD transistors 408 associated with the memory cells, and may provide reliability estimates based on the reliability groups to a soft decision decoder. For example, a read component 150 may provide lower reliability estimates to the decoder for bits associated with very downshifted SGD transistors 408 than for bits with somewhat downshifted or nominal SGD transistors 408. Using this reliability information in a soft decision decoder may reduce or avoid uncorrectable errors, thus avoiding the need to mark a block of cells as bad or to recalibrate or recondition the SGD transistors 408.

When reading data from a block of memory cells in an array, SGD downshift may be measured or sensed once for the block and used multiple times for grouping bits from memory cells into reliability groups for each row of memory cells in the block. In some embodiments, the SGD read for a block may be omitted if there is no indication of an SGD downshift problems (e.g., if bit error rates are low), but performed if an SGD downshift problem is suspected. Thus, using reliability information based on SGD downshifts may be an efficient addition to other reliability information, because the delay to read SGD voltages occurs once in a block read and provides reliability information for multiple rows of cells in the block.

In some embodiments, SGD transistors 408 may be refreshed or recalibrated to mitigate SGD downshift, in a process similar to programming the floating gate transistors 410. Program or erase pulses may be applied to the control gate of SGD transistors 408 to change the threshold voltages for these transistors. However, recalibrating a block of memory cells by reprogramming SGD transistors 408 may be time consuming, and may involve moving data to another block before reprogramming the SGD transistors 408. If the reprogramming fails, a die controller 206 or device controller 126 may retire the block from use. Because SGD reprogramming is time consuming and risks removing a block from use entirely, it may be avoided unless error rates are too high (e.g., above some threshold to trigger SGD reprogramming). Accordingly, in various embodiments, using a read component 150 to provide SGD-based reliability estimates to a soft-decision decoder may improve decoding performance and reduce rates of uncorrectable errors, thus extending the time between time-consuming and risky SGD reprogramming processes.

In the depicted embodiment, the floating gate transistors 410 are NAND flash storage cells. However, in various embodiments, for other types of storage cells including resistive storage cells, magnetic storage cells, phase change storage cells, or the like, transistors similar to SGD transistors 408 may be similarly arranged to couple or decouple memory cells from bit lines, and thus may similarly affect reliability rates. Thus, a read component 150 in such an embodiment may similarly use information about downshifted transistors as a basis for grouping bits into reliability groups and providing per-group reliability estimates to a soft-decision decoder. Read components 150 are described in further detail below with reference to FIGS. 7 and 8.

Figure 5:
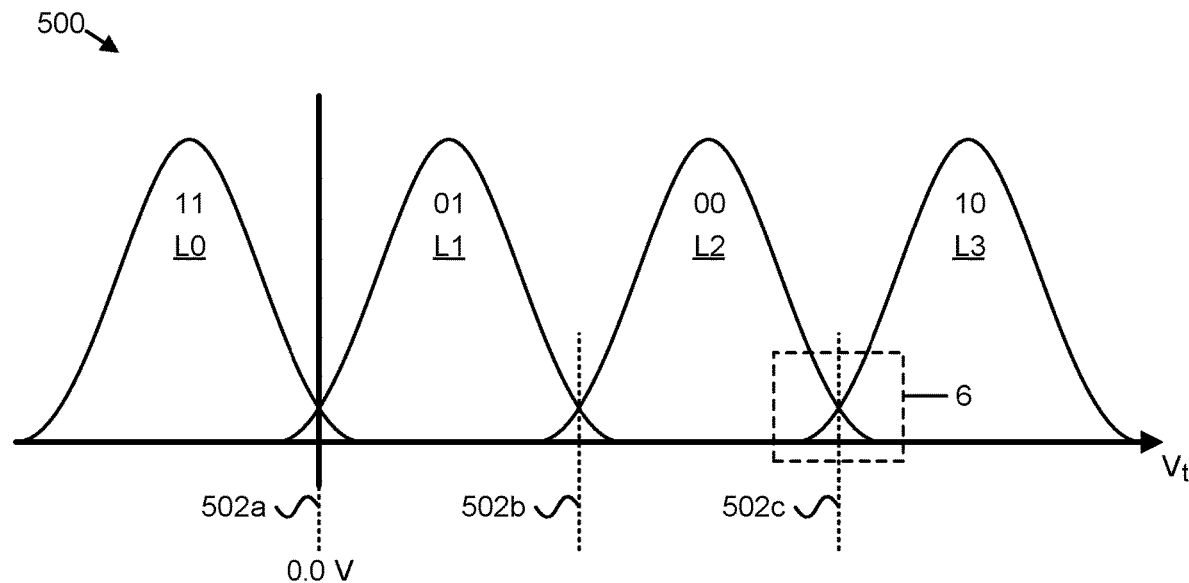
FIG. 5 is a graph illustrating a distribution of threshold voltages for cells of a non-volatile memory array, in one embodiment.

FIG. 5 is a graph 500 illustrating a distribution of threshold voltages for cells of a non-volatile memory array 200, in one embodiment. In the depicted embodiment, cells are flash memory cells where the threshold voltage Vt of a cell is alterable to store data, and range of possible values for the threshold voltage Vt is depicted on the horizontal axis of the graph 500. References to a threshold voltage Vt are provided as a non-limiting example. In another embodiment, a non-volatile memory array 200 may include another type of cell with another property that may be similarly divided into states to store data. For a given threshold voltage on the horizontal axis, the height of the line on the graph 500 indicates the number or proportion of cells with that threshold voltage.

In the depicted embodiment, the range of possible threshold voltages Vt for a NAND flash memory cell is divided into four subranges or states L0-L3 by read thresholds 502*a-c*, represented by vertical dashed lines. In another embodiment, a range of possible threshold voltages Vt for a NAND flash cell may be divided into more or fewer than four states. In the depicted embodiment, cells are erased into the lowest state L0, and may be programmed into higher states L1-L3. The states L0-L3 correspond to data values. For example, in the depicted embodiment, the four states L0, L1, L2, and L3 are mapped to the data values "11," "01," "00," and "10," respectively, so that the cell stores two bits of information. Various other mappings between cell states and data values may be used, in various embodiments. Sense operations may determine whether the threshold voltage Vt for a cell is above or below one of the read thresholds 502, and thereby determine the state of the cell and the corresponding data value. Sense operations may be performed as described above with reference to FIG. 4, by applying bias conditions to cells so that a bit line current or another electrical result depends on the state of the cell.

The graph 500 indicates that cells are programmed or erased to produce a uniform distribution of threshold voltages among states L0-L3. In practice, the distribution of states for a set of cells may not be uniform. For example, if a long string of zeroes is written to a set of cells, more cells may be in the L2 state, which encodes "00" than in the other states. However, data compression or whitening algorithms may make the distribution of states substantially uniform over a large set of cells.

Although the distribution of threshold voltages for cells may be substantially uniform among states L0-L3, the distribution is depicted as forming a bell-shaped peak in each state. In some embodiments, a cell may be programmed by issuing voltage pulses that alter the threshold voltage Vt for the cell to be at or near a target voltage in the middle of the range of voltages that defines the state. Thus, a bell-shaped peak may be centered on the target programming voltage, or the like. The width of the peaks may be affected by variations in the cells and the programming process, or by error-causing phenomena such as read disturbs, program disturbs, stress-induced leakage current, or the like. Although symmetric, bell-shaped peaks are shown, skewed distributions and other distributions are possible. Over time, the distributions may widen or skew as the threshold voltage of cells move from their originally programmed values. Additionally, distributions may shift due to temperature. For example, the threshold voltage of a transistor may be temperature dependent, so that the location and width of the peaks changes depending on the current temperature.

In the depicted graph 500, each peak represents the distribution of cells originally programmed to a particular state. Thus, there are four peaks corresponding to the four L0-L3 states. However, cells originally programmed to threshold voltages in one state may, after some amount of time, have drifted to have threshold voltages in another state. Thus, the individual peaks significantly overlap each other at or near the read thresholds 502. (The overall distribution for cells of the array may be a sum of the peaks depicted for cells programmed to each state). A sense operation that determines the current state of a cell relative to the read thresholds 502 may result in a data error if the threshold voltage for the cell has crossed one of the read thresholds 502 so that the cell is currently not in the state that it was programmed (or erased) to.

Figure 6:
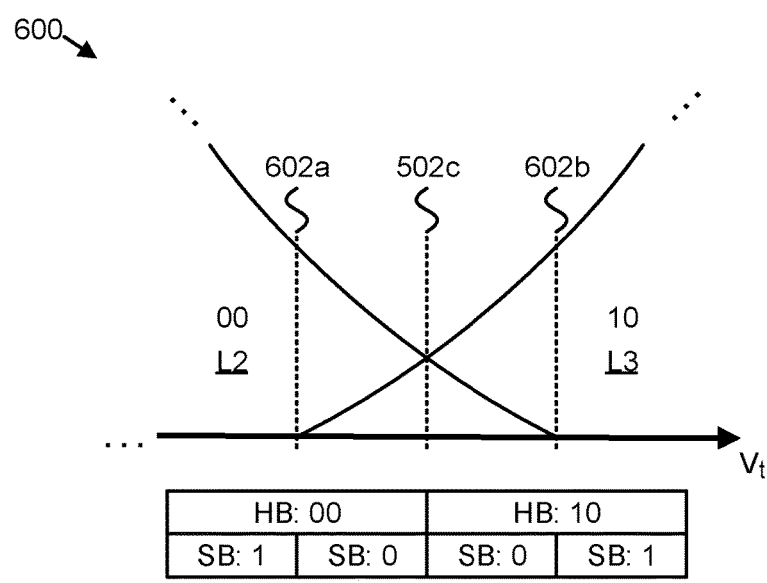
FIG. 6 is a graph illustrating a distribution of threshold voltages near a boundary between states, in one embodiment.

FIG. 6 is a graph 600 illustrating a distribution of threshold voltages near a boundary between states. A dashed rectangle in FIG. 5 indicates the region of the distribution that is depicted in further detail in FIG. 6, at or near the read threshold 502c between the L2 and L3 states. Read thresholds that define states (or boundaries between states), such as the read thresholds 502a-c of FIG. 5, may be referred to as "hard" read thresholds, and information about the cell states in relation to the boundary-defining "hard" read thresholds may be referred to herein as "hard bits." A read operation to determine the hard bits may be referred to as a hard read operation, or a hard bit read.

As described above with reference to FIG. 5, the L0, L1, L2, and L3 states are mapped to the data values "11," "01," "00," and "10," respectively. Thus, sensing the cell states in relation to the read thresholds 502a-c may determine or read one or more of the hard bits for a cell. In FIG. 6, if a read component 150 determines that the threshold voltage Vt for the cell is above the hard read threshold 502c, then the cell is in the L3 state, and the hard bits "10" have been read. Conversely, if a read component 150 determines that the threshold voltage Vt for the cell is below the hard read threshold 502c (and above the hard read threshold 502b shown in FIG. 5), then the cell is in the L3 state, and the hard bits "00" have been read. Although complete hard bit values of "00" and "10" corresponding to the L2 and L3 states are depicted in FIG. 6, only the first bit of each of those values differs between the L2 and L3 states. Thus, in some embodiments, a read component may perform a read operation for the second bit without sensing at the hard read threshold 502c (e.g., by sensing only at the read threshold 502b where the second bit changes), or may perform a read operation for the first bit by sensing at the hard read thresholds 502a, 502c without sensing at the read threshold 502b where the first bit does not change. In a single-bit read operation, the hard bits on either side of the read threshold 502c may be "0" and "1" rather than "00" and "10."

However, due to overlap in the distributions of cells originally programmed to the L2 and L3 states, the hard bit(s) may be in error. Therefore, in the depicted embodiment, a read component 150 uses soft read thresholds 602 are to read soft bits from the cells. Determining soft bits from the cells may be referred to as a soft read operation, or a soft bit read. In the depicted embodiment, the soft read thresholds 602 are voltages that may be applied as read voltages (as described with reference to FIG. 4) to determine if the threshold voltage Vt of a cell is above or below the applied read voltage. In another embodiment, however, a soft read threshold used to determine soft bits may be a resistance threshold, a current threshold, or the like, depending on the type of hard read threshold that is used to define the states.

In various embodiments, "soft bits" may be results from the soft read operation, and may indicate reliability of the hard bits, confidence in the hard bits, or the like. For example, in the depicted embodiment, the soft bits are single-bit values where a soft bit value of "1" indicates that hard bits are more reliable, and a soft bit value of "0" indicates that the hard bits are less reliable. In another embodiment, soft bit values may be inverted so that a "0" indicates greater reliability.

In the depicted embodiment, results of sensing whether the threshold voltage Vt for a cell is above or below two soft read thresholds 602a-b may be combined with an inverted exclusive or (NXOR) operation that outputs a 0 if the inputs are different or a 1 if the inputs are the same, to determine the soft bits. For example, if the threshold voltage Vt for a cell is above both of the soft read thresholds 602a-b, or below both of the soft read thresholds 602a-b, then the resulting soft bit is a "1," indicating that the threshold voltage Vt for the cell is not near the hard read threshold 502c, and that the hard bits should be treated as reliable. However, if the threshold is above the first soft read threshold 602a but below the second soft read threshold 602b, then the resulting soft bit is a "0," indicating that the threshold voltage Vt for the cell is near the hard read threshold 502c, and that the hard bits should be treated as less reliable, or as possibly erroneous.

In the depicted embodiment, a read component 150 determines soft bits in relation to two soft read thresholds 602 for one hard read threshold 502. In another embodiment, a read component 150 may determine soft bits in relation to more or fewer than two soft read thresholds 602 per hard read threshold 502. For example, in one embodiment, sensing using four soft read thresholds 602, two on either side of the hard read threshold 502, may provide additional soft bits to indicate different degrees of reliability for the hard bits.

In another embodiment, a read component 150 may determine that errors due to drift in one direction are more likely than errors due to drift in another direction, and may determine soft bits in relation to the hard read threshold 502 and a single soft read threshold 602 in the more likely drift direction from the hard read threshold 502. For example, long retention times with infrequent data access may suggest that cells are more likely to drift to lower-voltage states due to charge leakage than to drift to higher-voltage states, and a read component 150 may use a single soft read threshold 602 at a lower voltage than the hard read threshold 502. Conversely, short retention times with frequent data access may suggest that cells are more likely to drift to high-voltage states due to read disturbs or program disturbs than to drift to lower-voltage states, and a read component 150 may use a single soft read threshold 602 at a higher voltage than the hard read threshold 502. In some embodiments, a read component 150 may determine a number of read thresholds 502, 602 to use for sensing, and a distance of the soft read thresholds 602 from the hard read threshold 502. For example, a read component 150 may determine numbers and locations of read thresholds based on factors such as current temperature, temperature at write time, data retention time, number of program/erase cycles, error rates for reading cells of a region of an array 200, error rates for reading cells of another region of an array 200, or the like.

In some embodiments, a read component 150 may group data bits read from cells into reliability groups based on soft bits from a soft read operation, and may provide reliability estimates to a soft-decision decoder based on the soft bits. For example, in the depicted embodiment where soft bits of "0" indicate that the corresponding hard bits are less reliable, the read component 150 may provide lower reliability estimates to a soft-decision decoder for hard bits where the corresponding soft bit is "0" than for hard bits where the corresponding soft bit is "1." This soft bit information may reflect the most recent known information about a cell's threshold voltage (or in some other embodiments, another physical property that is altered to store data). Thus, a soft-decision decoder using reliability estimates based on a soft bit read may have significantly better performance than other ECC decoders.

However, soft bits are not persistent physical characteristics associated with cells, but are measurements of the alterable physical characteristic that is changed for a cell every time the cell is programmed or erased. Thus, a read component 150 that bases reliability estimates on soft bits may read soft bits every time it produces reliability estimates. Conversely, a read component 150 that bases reliability estimates on persistent physical characteristics may use permanent characteristics that do not need to be repeatedly determined, such as an interface bit index, or slowly changing characteristics that can be occasionally re-read or redetermined, such as SGD downshifts that can be read at the beginning of a block and applied to multiple subsequent read operations for the block.

In some embodiments, however, a read component 150 may divide bits from memory cells into reliability groups based on one or more persistent physical characteristics and based on soft bits from a soft read operation. Certain characteristics may be independent or orthogonal, thus multiplying the number of groups. For example, instead of having two groups for soft bits of zero and one, or instead of having eight groups for eight different interface bit indices, a read component 150 may use sixteen groups where the grouping is based on both the soft bits and the interface indices. Those groups may be split again into twice the number of groups for downshifted verses non-downshifted SGD transistors.

Thus, the number of groups may multiply as a read component 150 adds to the number of independent characteristics tracked as a basis for grouping, or to the number of relevant bins or groups for each characteristic. Too few groups may provide unsatisfactory error correction performance, because reliability estimates provided to an ECC decoder based on the grouping will be confounded by other characteristics that the grouping does not account for. Conversely, using too many groups risks over-fitting, where the reliability estimates are more based on the error history for individual cells than on useful similarities between cells. Additionally, a large number of groups may involve a considerable amount of memory or storage space for recording and updating per-group reliability estimates. A person of ordinary skill in possession of this disclosure will recognize how to select a basis for grouping and a number of reliability groups that strikes a balance between using too few groups and too many, without an undue amount of experimentation.

Figure 7:
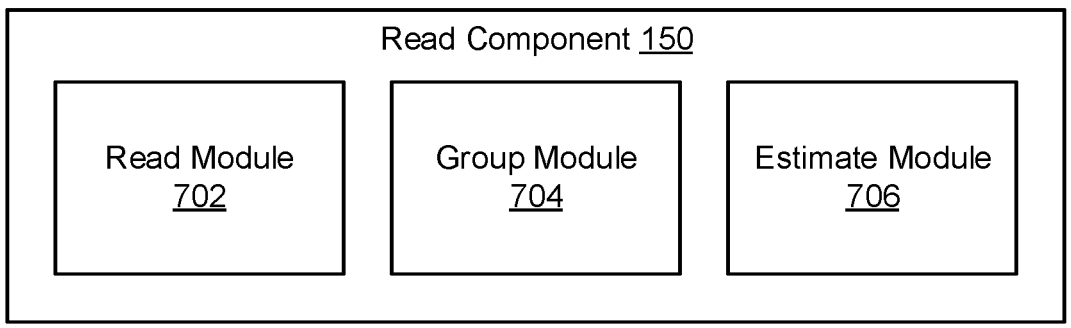
FIG. 7 is a schematic block diagram illustrating one embodiment of a read component.

FIG. 7 depicts one embodiment of a read component 150. In various embodiments, a read component 150 may be substantially as described above with reference to FIGS. 1-6, and may include or communicate with portions of a die controller 206, a device controller 126, a device driver, or the like. In the depicted embodiment, the read component 150 includes a read module 702, a group module 704, and an estimate module 706, which are described below.

In general, in various embodiments, a read component 150 is configured to read a set of encoded bits from a set of memory cells, and to divide the encoded bits into reliability groups based on one or more persistent physical characteristics associated with cells of the set of cells, such as an interface bit index (IBI) or an SGD downshift. With the encoded bits divided or assigned into reliability groups, a read component 150 may provide reliability estimates based on the reliability groups to a soft decision decoder, for decoding the encoded bits. Reliability estimates for groups based on persistent physical characteristics may be used in addition to or in place of reliability estimates based on a soft bit read of the cells' alterable physical property, to improve the performance of an ECC decoder, by increasing decoding speed, reducing rates of uncorrectable errors, or the like.

A read module 702, in various embodiments, is configured to read a set of encoded bits from a set of cells of a memory array 200. A read module 702 may include or communicate with various other components for reading data from cells, such as row circuits 202, column circuits 304, a die controller 206, a device controller 126, a device driver, or the like. Reading data from cells may include applying biases to bit lines and/or word lines coupled to the cells, sensing a resulting voltage current or other signal on bit lines (e.g., using a sense amplifier), and producing or recording binary data based on the analog bit line signal (e.g., storing the output of sense amplifiers in latches). Reading techniques for an array of NAND memory cells are described above with reference to FIG. 4. Various other or further biasing and sensing techniques may similarly be used by a read module 702 to read encoded bits from cells.

Encoded bits, in various embodiments, may be data that has been encoded using an error correcting code (ECC). A set of encoded bits may be a group or collection of bits that were encoded as part of the same group or collection of bits by an ECC encoder, or that are to be decoded as part of the same group or collection of bits by an ECC decoder.

In various embodiments, an "(n, k)" error correcting code may be a code that encodes blocks of k bits into codewords of n bits, so that the codewords include n-k bits of redundant data. Thus, the term "codeword" is sometimes used in the field of error correction to refer specifically to one of the $2^k$ possible n-bit outputs of an ECC encoder, corresponding to the $2^k$ possible k-bit inputs. In this specification, the term "valid codeword" is used in this sense, to refer to valid output of an ECC encoder, without errors. However, after a codeword has been written to a memory array 200, retained over some period of time, read from the memory array 200, sent over one or more buses 125, 127 and so on to an ECC decoder, the bits received by the ECC decoder may or may not be a valid codeword, due to the possibility of errors. The term "received codeword" is used herein to refer to a group or collection of bits that was once (and may still be) a valid codeword, but into which errors may have been introduced. In other words, a valid codeword is what an ECC encoder produces or sends, and a received codeword is what an ECC decoder receives and attempts to decode.

In some embodiments, the set of encoded bits that the read module 702 reads from a set of cells may be a received codeword for an error correcting code. In some embodiments, the set of bits read by the read module 702 may be encoded data for a 64 bit data burst (similar to data transfer sizes for DRAM memory), an encoded page of data, an encoded block of data, or the like, depending on the granularity of read operations supported by a memory array 200, a memory element 123, a memory device 120, or the like. Thus, the set of cells from which the read module 702 reads the set of cells may be a row of cells (e.g., corresponding to a page of data), a portion of a row (corresponding to a partial page or a 64 bit burst, a block of cells, or the like.

The group module 704, in various embodiments, is configured to divide the encoded bits into reliability groups based on one or more persistent physical characteristics associated with cells of the set of cells. Where the set of encoded bits read by the read module 702 is a received codeword for an error correcting code, a group module 704 may divide bits of the received codeword into different reliability groups.

Reliability groups, in various embodiments, may be subsets of the set of encoded bits (e.g., bits of a received codeword) read by the read module 702. Bits assigned to a reliability group have some reliability-based commonality, so that reliability estimates may be provided to a soft-decision ECC decoder on a per-group basis. Thus, reliability groups may be groups, clusters, bins, or the like of bits that are (or will be) estimated to have similar reliability for bits within a group. In various embodiments, a group module 704 may define reliability groups based on persistent physical characteristics, prior to dividing encoded bits into those groups, or may use predefined reliability groups. In some embodiments, group definitions may be based on a single physical characteristic, such as an interface bit index or an SGD downshift. In some embodiments, group definitions may be based on more than one physical characteristic, such as the interface bit index and the SGD downshift. In some embodiments, reliability groups may be based on at least one persistent physical characteristic, and on something other than a persistent physical characteristic, such as soft bits from soft read operations.

As used herein, a group module 704 "dividing" bits into reliability groups means that there at least two groups for the bits of a received codeword (or other set of bits read by the read module 702) to be divided between, or assigned to. Occasionally, for some read operations where all the bits are more reliable or all the bits are less reliable, dividing bits into reliability groups may involve defining at least two reliability groups and assigning all the bits to one of the groups. For example, if reliability groups are defined based on whether SGD transistors are downshifted, then bits of a received codeword may all be assigned to a high-reliability group if none of the corresponding SGD transistors are downshifted. However, because there is at least the possibility of assigning different bits of a received codeword (or other set of bits read by the read module 702) to different groups if some of them had been less reliable, this may still be referred to as "dividing" bits into reliability groups.

Also, if errors are present in a received codeword, reliability estimates may be more useful to a soft-decision decoder if they are not identical for all the bits, so that they usefully identify one or more bits that are estimated to be more or less reliable than the others. Thus, a group module 704 may define reliability groups such that, at least a significant percentage of the time, dividing bits into reliability groups involves assigning different bits of a received codeword (or other set of bits read by the read module 702) to different groups.

In various embodiments, the group module 704 may divide bits into reliability groups in various ways, such as by recording for each group, which bits are in the group (e.g., group 1 includes bits 1, 3, 7, and 9; group 2 includes bits 2, 4, 5, 6, and 8; etc.), assigning a group identifier to each bit (e.g., bit 1 is in group 4, bit 2 is in group 4, bit 3 is in group 2, etc.) maintaining a data structure that associates bits with groups, or the like. The group module 704 determines which bits are in which groups, thus dividing or assigning bits of a received codeword (or other set of bits read by the read module 702) into groups. Although terms such as "dividing," "grouping," "binning," "assigning to groups," and the like are sometimes used with things other than data values to refer to moving the things to be physically grouped or located together, such terms are used herein not to imply a reordering or moving of the bits, but to refer to the group module 704 determining which bits correspond to (e.g., are "in") which groups. Thus, the group module 704 dividing encoded bits into reliability groups may include determining a correspondence between the encoded bits and at least two reliability groups.

Accordingly, in various embodiments, a group module 704 may include or communicate with memory, or storage hardware to reference or update definitions for reliability groups, determine information about physical characteristics (e.g., by referencing recorded information about SGD downshifts), reference or update a data structure that associates bits with groups, or the like. Similarly, a group module 704 may include or communicate with logic hardware to calculate information (e.g., by using a cell position modulo the number of data lines to determine an interface bit index).

In various embodiments, the group module 704 may divide or assign encoded bits read from a set of cells into reliability groups based on one or more persistent physical characteristics associated with cells of the set of cells from which the encoded data was read. In general, cells of a memory array may be referred to as being "associated" with their own physical characteristics, and with physical characteristics of components of than the cell, which affect reliability of data from the cells. For example, a cell may be "associated" with its position in a memory array, because that position is directly a physical characteristic of that cell. Alternatively, a cell may be "associated" with characteristics of other components, such as the SGD downshift of a drain select gate transistor for a NAND string that the cell is in, or the data line delay for a data line that data read from the cell will be transmitted over, because although those are physical characteristics of other components and not of the cell itself, those other components are (or will be) coupled to the cell, used to send or receive data from the cell, or the like.

Additionally, in some embodiments, data values that refer to, are correlated with, or indicate various physical characteristics may themselves be referred to as physical characteristics associated with cells. For example, a physical characteristic for a data line that will be used to communicate with the cell may be its position or order within a group of data lines, while an interface bit index that specifies or identifies that data line may be just an integer or unitless quantity. Nevertheless, the interface bit index for a cell may still be referred to as a physical characteristic. Similarly, a physical characteristic for an SGD transistor may be its threshold voltage, while a binning or grouping of the SGD threshold voltage into bins or ranges (e.g., nominal and downshifted bins based on a comparison of the SGD downshift to some boundary value that separates the bins) may be a unitless quantity. Nevertheless, an indicator of which bin an SGD downshift is in may still be referred to as a physical characteristic.

A persistent physical characteristic associated with a memory cell, in various embodiments, which may be used as the basis for the group module 704 to assign a data value from the memory cell into a reliability group, may be a characteristic other than the alterable physical property that is used to store data. In further embodiments, the term "persistent" may refer to a characteristic that is not directly changed or reset by writing to or accessing a cell. For example, writing to a flash memory cell changes non-persistent characteristics such as the threshold voltage for the cell, the program/erase count for the cell (which is incremented), the retention time for the cell (which is reset to zero), and the like. Similarly, reading from a cell may change non-persistent characteristics such as a read count.

In some embodiments, a "persistent" physical characteristic associated with a cell may be effectively permanent. For example, where interface bit indices are associated with cells based on the positions of cells in a row, the interface bit index for a cell is not expected to change, because the position of the cell in its row does not change. In some embodiments, a "persistent" physical characteristic associated with a cell may not be permanent, and may change over time, but not as a direct result of writing to or accessing a cell. For example, wear due to repeated use of SGD transistors in read and write operations may affect SGD downshifts, but this wear is an indirect effect of repeated access, not a direct result of a read or write operation.

In general, in various embodiments, certain persistent physical characteristics associated with cells in a memory array 200 may correspond to lower or higher reliability for bits stored by those cells. For example, as described above with reference to FIGS. 3 and 4, cells' reliability may be associated with interface bit indices for the cells due to different delays on different data lines, or with SGD downshifts due to incomplete or failed program inhibition by downshifted SGD transistors. Thus, in various embodiments, using a group module 704 to group bits from cells into different reliability groups based on one or more persistent physical characteristics may facilitate assigning different reliability estimates to different bits of a received codeword on a per-group basis, for use by a soft-decision ECC decoder.

The estimate module 706, in various embodiments, is configured to provide reliability estimates to a soft decision decoder for decoding the encoded bits or the received codeword read by the read module 702. In further embodiments, the estimate module 706 is configured to provide the reliability estimates based on the reliability groups into which bits were divided by the group module 704. In various embodiment, an estimate module 706 may provide per-group reliability estimates to a soft-decision decoder in various ways, such as by transmitting reliability estimates over a bus, saving reliability estimates to a shared memory address, or the like.

A reliability estimate, in various embodiments, may be any information that indicates or corresponds to estimated reliability for a bit. For example, a reliability estimate may be in the form of a categorization of bits as reliable, unreliable (possibly intermediate reliability), or the like, or in the form of probabilities or likelihoods that the hard bits are correct, probability or likelihood ratios, log-likelihoods, differences of log-likelihoods (equivalent to logs of likelihood ratios, or the like.

In some embodiments, reliability estimates may be separate information received by a soft-decision decoder in addition to hard bits. For example, probabilities that the hard bits are correct may accompany the hard bits. In other embodiments, reliability estimates may incorporate the hard bits, so that hard bits are not separately received by a soft-decision decoder. For example, reliability estimates in the form of a ratio between the likelihood that a bit is a binary one and the likelihood that the bit is a binary zero may indicate that the hard bit is a one if the ratio is greater than one, or a zero of the ratio is less than one. Similarly, reliability estimates in the form of a log of the likelihood ratio (a "log likelihood ratio" or "LLR") may indicate that the hard bit is a one if the LLR is positive, and that the hard bit is a zero if the LLR is negative. In various embodiment, reliability estimates may indicate which hard bits of ECC-encoded data are more likely or less likely to be erroneous, and thus facilitate a soft-decision decoder determining which bits are actually erroneous, to decode and recover the original unencoded data.

A soft-decision decoder may use reliability estimates to facilitate decoding of a received ECC code. For example, a decoder may iteratively attempt to determine which bits of a received codeword to flip in order to recover a valid codeword from which the original, unencoded data can be recovered, and may identify bits with lower estimated reliability as likely candidates for bit flips.

In various embodiments, an estimate module 706 may provide reliability estimates based on the reliability groups to which bits were assigned by the group module 704. For example, in an embodiment where bits are divided into eight groups for eight different interface bit indices, an estimate module 706 may determine eight reliability estimates for the eight different groups, and provide the reliability estimates to a soft-decision decoder on a per-group basis. A reliability estimate based on a group may correspond to or be associated with the group in some way. For example, in some embodiments, the estimate module 706 may include or communicate with memory or storage hardware to store a table (or other data structure) of different reliability estimates for different groups, and may reference the recorded reliability estimates.

As the number of read operations for a memory array increases over time, an estimate module 706 may have more accurate historical reliability information it can use to determine per-group reliability estimates. For example, immediately after a delay recalibration that updates a delay for sampling data from data lines, reliability groups for different interface bit indices may all have similarly high reliability, and an estimate module 706 may provide the same reliability estimate to a soft-decision decoder for each group. However, if a data line becomes further desynchronized from the other data lines, errors occurring on that line may make cells with the corresponding interface bit index less reliable. The estimate module 706 may receive information about errors from the soft-decision decoder, and may use that information to determine a lower reliability estimate for the relevant reliability group in subsequent read operations.

In some embodiments, soft-decision decoders may be implemented at one or more levels of a system 100, and read components 150 that divide encoded bits into reliability groups and provide per-group reliability estimates may be implemented at one or more corresponding levels of the system 100 to communicate with the decoder(s). Thus, a controller that includes a read component 150 may be a die controller 206, a device controller 126, a device driver, or the like. For example, a soft-decision decoder implemented by a die controller 206 may be able to efficiently correct errors due to SGD downshift on the same memory element 123, and a read component 150 may be implemented on the memory element to provide reliability estimates to that decoder. However, a decoder at the memory element level may not be able to correct errors due to data line delay in sending the read data from the memory element 123 to the device controller 126, because that delay occurs off of the memory element 123. Thus, a soft decision decoder may be implemented on a device controller 126, and a read component 150 may be implemented on the device controller 126 to provide reliability estimates to that decoder. Additionally, in some embodiments, a soft decision decoder implemented at the device controller level may have more computational or hardware complexity than a decoder implemented at the memory element level, and received codewords that are uncorrectable by a simpler decoder at a lower level may be passed up to the more complex decoder at a higher level. At a still higher level, ECC decoders and/or read components 150 may similarly be implemented in software (e.g., by a processor executing code) for a device driver.

Figure 8:
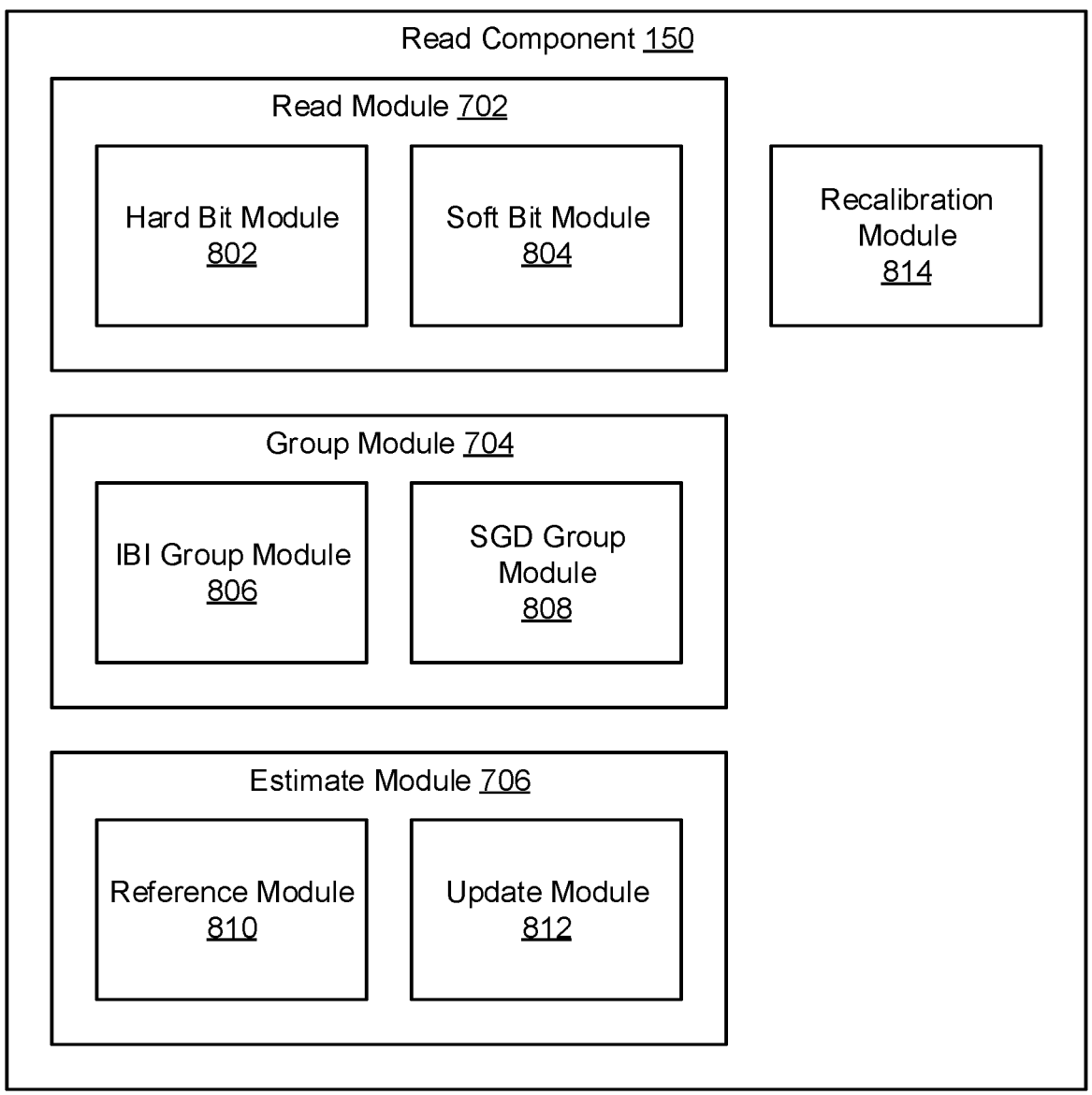
FIG. 8 is a schematic block diagram illustrating another embodiment of a read component.

FIG. 8 depicts another embodiment of a read component 150. In the depicted embodiment, the read component 150 may be substantially similar to the read components 150 described above with reference to FIGS. 1-7, including a read module 702, a group module 704, and an estimate module 706. In the depicted embodiment, the read module 702 includes a hard bit module 802 and a soft bit module 804. In the depicted embodiment, the group module 704 includes an IBI group module 806 and an SGD group module 808. In the depicted embodiment, the estimate module 706 includes a reference module 810 and an update module 812. In the depicted embodiment, the read component 150 includes a recalibration module 814.

In the depicted embodiment, the read module 702 includes a hard bit module 802 and a soft bit module 804. To read bits of encoded data from cells, the read module 702 may use the hard bit module 802 to determine binary values, in a hard bit read, and may use the soft bit module 804 to perform a soft read operation as described above with reference to FIGS. 5 and 6. In some embodiments, the division of bits into reliability groups by the group module 704 may be based on one or more persistent physical characteristics, and based on soft bits from a soft read operation performed by the soft bit module 804.

In the depicted embodiment, the group module 704 includes an IBI group module 806 and an SGD group module 808. In some embodiments, the group module 704 uses the IBI group module 806 to divide bits into groups based on an interface bit index (IBI). For example, the IBI group module 806 may reference or determine an interface bit index for cells, and divide bits from those cells into the corresponding reliability groups. In some embodiments, the group module 704 uses the SGD group module 808 to divide bits into groups based on SGD downshifts. For example, the SGD group module 808 may perform SGD reads to determine which SGD transistors are downshifted, and assign bits from cells corresponding to downshifted SGD transistors into a lower-reliability group than bits from cells where the SGD transistor is not downshifted.

In the depicted embodiment, the estimate module 706 includes a reference module 810 and an update module 812. In some embodiments, the estimate module 706 uses the reference module 810 to provide reliability estimates by referencing recorded reliability estimates for the reliability groups. For example, the estimate module 706 may maintain a record of prior per-group error rates, and the reference module 810 may identify per-group reliability estimates from that record. The update module 812 may update the recorded reliability estimates based on feedback from a soft decision decoder. For example, certain soft-decision decoders may receive LLRs as reliability estimates for bits and iteratively update the LLRs based on the error correcting code until determining a valid codeword that can be decoded. Such a decoder may return the updated LLRs from later iterations to the estimate module 706 that provided the initial LLRs for the first iteration, and the update module 812 may record the updated LLRs (or a related quantity such as a per-group average for the LLRs) in the record of per-group reliability estimates.

In the depicted embodiment, the read component 150 includes a recalibration module 814. In some embodiments, a recalibration module 814 is configured to initiate a recalibration in response to one or more reliability estimates failing to satisfy a threshold. For example, if the update module 812 updates a recorded reliability estimate, but the updated estimate reflects insufficient reliability (e.g., below a threshold for acceptable reliability), the recalibration module 814 is configured to initiate a recalibration to improve reliability of the data from the cells. In one embodiment, where bits are grouped based on interface bit indices, a recalibration may be a delay recalibration that updates a delay for sampling data from data lines. In another embodiment, where bits are grouped based on SGD downshift, a recalibration may be a reprogramming of SGD transistors to higher threshold voltages. Various other or further types of recalibrations will be recognized as improving per-group reliability for groups defined based on various other or further physical characteristics.

Figure 9:
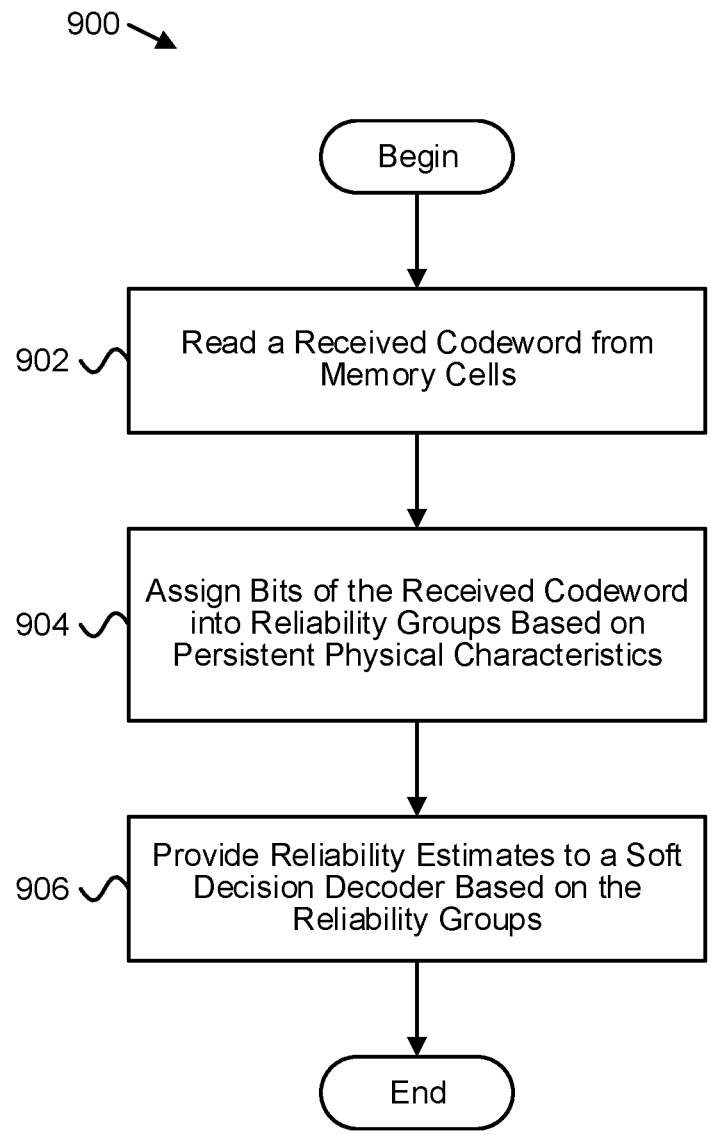
FIG. 9 is a flow chart illustrating one embodiment of a method for error correction based on physical characteristics for memory.

FIG. 9 is a flow chart illustrating one embodiment of a method 900 for error correction based on physical characteristics for memory. The method begins, and a read module 702 reads 902 a received codeword for an error correcting code from a set of memory cells. A group module 704 assigns 904 bits of the received codeword into reliability groups based on one or more persistent physical characteristics associated with cells of the set of cells. The one or more persistent physical characteristics used as a basis for the grouping may be characteristics that are not directly changed by writing data to the set of cells, such as an interface bit index and/or an SGD downshift. An estimate module 706 provides 906 reliability estimates based on the reliability groups to a soft decision decoder for decoding the received codeword, and the method 900 ends.

Figure 10:
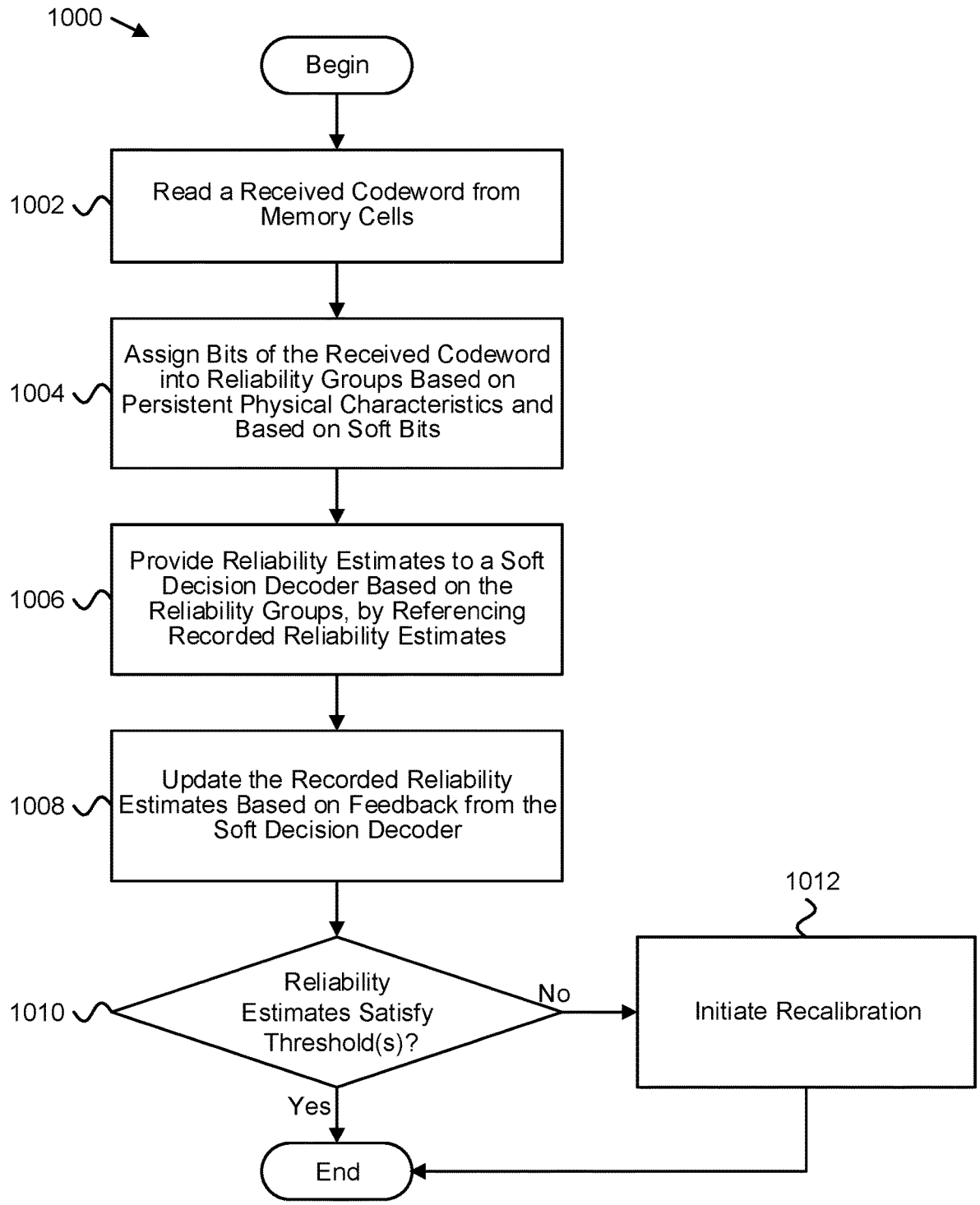
FIG. 10 is a flow chart illustrating another embodiment of a method for error correction based on physical characteristics for memory.

FIG. 10 is a flow chart illustrating another embodiment of a method 1000 for error correction based on physical characteristics for memory. The method begins, and a read module 702 reads 1002 a received codeword for an error correcting code from a set of memory cells. Reading 1002 the received codeword may include a soft read operation to determine soft bits. A group module 704 assigns 1004 bits of the received codeword into reliability groups based on one or more persistent physical characteristics associated with cells of the set of cells, and based on soft bits from a soft read operation. An estimate module 706 provides 1006 reliability estimates based on the reliability groups to a soft decision decoder, by referencing reliability estimates for the reliability groups. The soft decision decoder may provide feedback in the form of updated per-group reliability estimates for future use, and the update module 812 may update 1008 the recorded reliability estimates based on feedback from the soft decision decoder.

The recalibration module 814 may determine 1010 if the updated reliability estimates satisfy one or more thresholds. If the thresholds are satisfied, the method 1000 ends. If one or more of the updated reliability estimates fail to satisfy a threshold, the recalibration module 814 may initiate 1012 a recalibration, and the method 1000 ends. A recalibration, in various embodiments, may be a delay recalibration for updating a delay for sampling data from data lines, an SGD recalibration for reprogramming SGD transistors, or the like.

Means for reading a set of encoded bits from a set of memory cells, in various embodiments, may include a memory element 123, row circuits 202, column circuits 204, a read component 150, a read module 702, a hard bit module 802, a soft bit module 804, a die controller 206, a device controller 126, a device driver and/or other logic or electronic hardware. Other embodiments may include similar or equivalent means for reading encoded bits.

Means for determining a correspondence between the encoded bits and at least two reliability groups, in various embodiments, may include a group module 704, and IBI group module 806, an SGD group module 808, a read component 150, a die controller 206, a device controller 126, a device driver, and/or other logic or electronic hardware. Other embodiments may include similar or equivalent means for determining a correspondence between encoded bits and reliability groups.

Means for providing reliability estimates based on the reliability groups to a soft decision decoder, in various embodiments, may include an estimate module 706, a reference module 810, a read component 150, a die controller 206, a device controller 126, a device driver, and/or other logic or electronic hardware. Other embodiments may include similar or equivalent means for providing reliability estimates.

Means for updating recorded reliability estimates, in various embodiments, may include an update module 812, a read component 150, a die controller 206, a device controller 126, a device driver, and/or other logic or electronic hardware. Other embodiments may include similar or equivalent means for updating reliability estimates.

Means for initiating a recalibration in response to one or more of the recorded reliability estimates failing to satisfy a threshold, in various embodiments, may include a recalibration module 814, a read component 150, a die controller 206, a device controller 126, a device driver, and/or other logic or electronic hardware. Other embodiments may include similar or equivalent means for initiating a recalibration.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus, comprising:
   an array of memory cells; and
   a controller configured to:
   read a set of encoded bits from a set of cells of the array;
   divide the encoded bits into reliability groups according to one or more persistent physical characteristics associated with cells of the set of cells, the one or more persistent physical characteristics comprising physical properties associated with the set of cells that are unchanged by writing data to the set of cells; and
   provide reliability estimates according to the reliability groups to a soft decision decoder for decoding the encoded bits.

2. The apparatus of claim 1, wherein the set of encoded bits is a received codeword for an error correcting code, such that the controller is configured to divide the bits of the received codeword into reliability groups.

3. The apparatus of claim 1, wherein the one or more persistent physical characteristics comprise an interface bit index, such that the controller is configured to divide bits into reliability groups based on interface bit indices.

4. The apparatus of claim 1, wherein the one or more persistent physical characteristics comprise a drain select gate (SGD) downshift, such that the controller is configured to divide bits into reliability groups based on SGD downshifts.

5. The apparatus of claim 1, wherein the controller is configured to divide the encoded bits into reliability groups based on the one or more persistent physical characteristics and based on soft bits from a soft read operation.

6. The apparatus of claim 1, wherein the controller is configured to provide the reliability estimates by referencing recorded reliability estimates for the reliability groups, and to update the recorded reliability estimates based on feedback from the soft decision decoder.

7. The apparatus of claim 6, wherein the controller is configured to initiate a recalibration in response to one or more of the recorded reliability estimates failing to satisfy a threshold.

8. The apparatus of claim 7, wherein the one or more persistent physical characteristics comprise an interface bit index, and the recalibration comprises updating a delay for sampling data from data lines.

9. The apparatus of claim 7, wherein the one or more persistent physical characteristics comprise a drain select gate (SGD) downshift, and the recalibration comprises reprogramming SGD transistors.

10. A method, comprising:
    reading, from a set of memory cells, a received codeword for an error correcting code;
    assigning bits of the received codeword into reliability groups according to one or more persistent physical characteristics associated with cells of the set of cells, the one or more persistent physical characteristics comprising physical properties associated with the set of memory cells that are unchanged by writing data to the set of memory cells; and
    providing reliability estimates according to the reliability groups to a soft decision decoder for decoding the received codeword.

11. The method of claim 10, wherein the one or more persistent physical characteristics comprise an interface bit index, such that assigning bits of the received codeword into reliability groups is based on interface bit indices.

12. The method of claim 10, wherein the one or more persistent physical characteristics comprise a drain select gate (SGD) downshift, such that assigning bits of the received codeword into reliability groups is based on SGD downshifts.

13. The method of claim 10, wherein assigning bits of the received codeword into reliability groups is based on the one or more persistent physical characteristics and based on soft bits from a soft read operation.

14. The method of claim 10, wherein providing the reliability estimates comprises referencing recorded reliability estimates for the reliability groups, the method further comprising updating the recorded reliability estimates based on feedback from the soft decision decoder.

15. The method of claim 14, further comprising initiating a recalibration in response to one or more of the recorded reliability estimates failing to satisfy a threshold.

16. An apparatus comprising:
   means for reading a set of encoded bits from a set of memory cells;
   means for determining a correspondence between the encoded bits and at least two reliability groups according to one or more persistent physical characteristics associated with cells of the set of cells, the one or more persistent physical characteristics comprising physical properties associated with the set of memory cells that are unchanged by writing data to the set of memory cells; and
   means for providing reliability estimates according to the reliability groups to a soft decision decoder for decoding the encoded bits.

17. The apparatus of claim 16, wherein the means for providing the reliability estimates references recorded reliability estimates for the reliability groups, the apparatus further comprising means for updating the recorded reliability estimates based on feedback from the soft decision decoder.

18. The apparatus of claim 17, further comprising means for initiating a recalibration in response to one or more of the recorded reliability estimates failing to satisfy a threshold.

* * * * *